(12) United States Patent
Wilkie et al.

(10) Patent No.: US 6,895,525 B1
(45) Date of Patent: May 17, 2005

(54) METHOD AND SYSTEM FOR DETECTING PHASE-LOCKED LOOP (PLL) CLOCK SYNTHESIS FAULTS

(75) Inventors: Bruce James Wilkie, Georgetown, TX (US); Amit Sumanlal Shah, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/378,425

(22) Filed: Aug. 20, 1999

(51) Int. Cl.[7] ............................ G06F 1/04; G06F 11/00
(52) U.S. Cl. ...................... 713/503; 713/500; 714/48; 714/700
(58) Field of Search ............................... 713/500, 503; 714/47, 48, 55, 700

(56) References Cited

U.S. PATENT DOCUMENTS

| | | | | |
|---|---|---|---|---|
| 4,980,899 A | * | 12/1990 | Troost et al. | 311/18 |
| 5,081,629 A | * | 1/1992 | Criswell et al. | 708/532 |
| 5,461,332 A | * | 10/1995 | Mirov et al. | 327/142 |
| 5,589,801 A | * | 12/1996 | Yamamura et al. | 327/159 |
| 5,673,004 A | * | 9/1997 | Park | 327/156 |
| 6,177,820 B1 | * | 1/2001 | Nakamura | 327/106 |
| 6,195,758 B1 | * | 2/2001 | Lundh et al. | 713/500 |

FOREIGN PATENT DOCUMENTS

EP      0 385 404 A2 * 9/1990

* cited by examiner

*Primary Examiner*—Ilwoo Park
(74) *Attorney, Agent, or Firm*—Carlos Munoz-Bustamante; Dillon & Yudell, LLP

(57) ABSTRACT

An electronic system includes a reference clock that generates a reference clock signal, at least one, phase-locked loop clock generator that synthesizes a derivative clock signal from the reference clock signal, and at least one digital circuit timed by the derivative clock signal. In addition, the electronic system includes a phase-locked loop clock synthesis fault detector having a phase detector and data storage for storing a historical indication of the phase of the derivative clock signal synthesized from the reference clock signal. The phase detector detects a change of phase of the derivative clock signals relative to the historical indication of the phase and, in response to this detection, signals that a clock synthesis fault has occurred.

20 Claims, 2 Drawing Sheets

METHOD AND SYSTEM FOR DETECTING PHASE-LOCKED LOOP (PLL) CLOCK SYNTHESIS FAULTS

BACKGROUND OF THE INVENTION

1. Technical Field

The present invention relates in general to electronic circuitry and in particular to clock generation circuitry. Still more particularly, the present invention relates to a method and system for detecting transient clock synthesis faults in phase-locked loop (PLL) clock generators.

2. Description of the Related Art

Highly integrated digital systems (e.g., computers) are currently migrating toward the use of a single system-wide reference clock from which all other clock signals are synthesized. The primary rationale for this approach has been to reduce the number of discrete crystal oscillators used in the system and to achieve clock synchronization between digital circuits within the system. In current systems, all of the derivative clock signals are synthesized from the reference clock signal utilizing phase-locked loop (PLL) clock generators.

A conventional PLL clock generator includes two basic components—a phase detector and an oscillator—that are connected in a closed-loop feedback configuration. The phase detector receives the reference clock signal and the derivative clock signal produced by the oscillator as inputs and outputs an error signal indicative of a phase difference between the two. This error signal is utilized to continuously adjust the phase and frequency of the derivative clock signal so that it tracks the reference clock signal. While the derivative clock signal may have the same or different frequency than the reference clock signal, the derivative and reference clock signals are intended to have a fixed phase relationship.

While conventional PLL clock generators are robust and are capable of maintaining lock (i.e., a fixed phase relationship between the reference clock signal and the derivative clock signal) for weeks or months of continuous operation, PLL clock generators are susceptible to transient errors and will occasionally loose lock with the reference clock signal. The probability that a PLL will loose lock is determined by the signal-to-noise ratio of the PLL inputs. Thus, if a noise spike occurs at a PLL input, the phase detector of the PLL will output an erroneous error signal, which will in turn cause the PLL oscillator to overcorrect. When this phenomenon occurs, the PLL momentarily looses lock and then regains lock usually within a single cycle of the reference clock signal.

This "cycle slip," while typically causing only a change in the phase relationship between the reference clock signal and the derivative clock signal, alters the clock-data timing relationship and therefore corrupts the data transmitted in synchronization with the derivative clock signal. In some environments, such as digital wireless communication, such data corruption is only a minor annoyance that results in the loss of one or more (typically non-critical) data packets. However, in complex digital systems such as multiprocessor computer systems, the data corruption resulting from PLL clock generation errors can be catastrophic, with errors cascading throughout the system.

SUMMARY OF THE INVENTION

The present invention recognizes that PLL clock generation errors have heretofore been neglected as a source of transient errors in complex digital systems. In addition, the present invention recognizes that, prior to the present invention, PLL clock generation errors, have been difficult to detect and correct given the infrequency of PLL cycle slip and the absence of any residual effect on the derivative clock signal.

Accordingly, the present invention provides a method and system for detecting transient clock synthesis faults in PLL clock generators.

An electronic system in accordance with the present invention includes a reference clock that generates a reference clock signal, at least one phase-locked loop clock generator that synthesizes a derivative clock signal from the reference clock signal, and at least one digital circuit timed by the derivative clock signal. In addition, the electronic system includes a phase-locked loop clock synthesis fault detector having a phase detector and data storage for storing a historical indication of the phase of the derivative clock signal synthesized from the reference clock signal. The phase, detector detects a change of phase of the derivative clock signals relative to the historical indication of the phase and, in response to this detection, signals that a clock synthesis fault has occurred.

All objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF ILLUSTRATIVE EMBODIMENT

Figure 1:
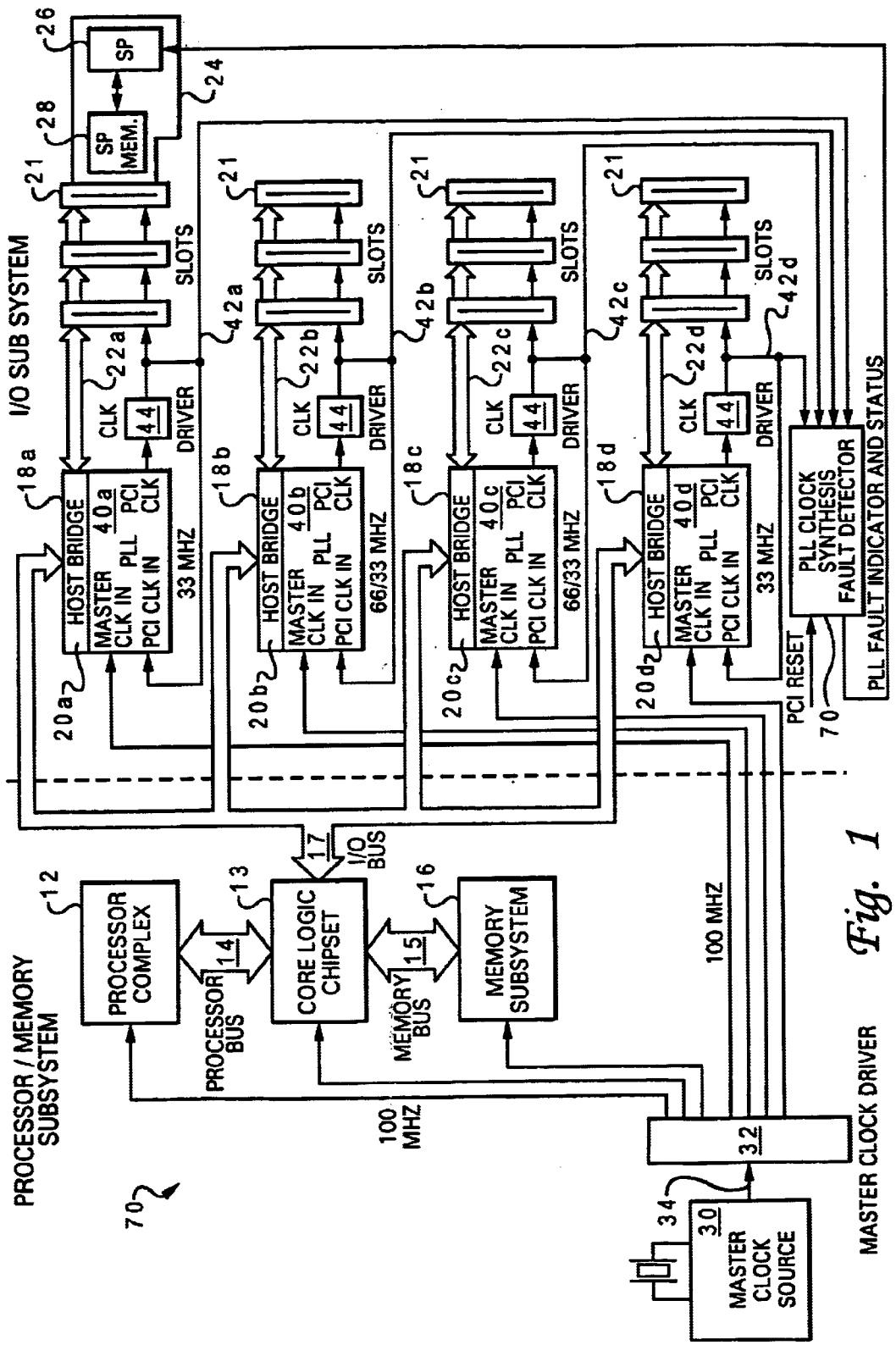
FIG. 1 depicts an illustrative embodiment of a data processing system with which the method and system of the present invention may advantageously be utilized.

The present invention is applicable to any electronic system in which a phase-locked loop (PLL) clock generator is utilized to synthesize a derivative clock signal from a reference clock signal. While thus broadly applicable to the electronic arts, the present invention is particularly useful in complex electronic systems such as data processing systems. Accordingly with reference now to the figures and in particular with reference to FIG. 1, there is depicted an illustrative embodiment of a data processing system including a PLL clock synthesis fault detector in accordance with then present invention.

As illustrated, data processing system 10, which can be realized, for example, as a workstation computer system such as the RS/6000® or as a server computer system such as the Netfinity™, both manufactured by International Business Machines (IBM) Corporation of Armonk, N.Y., includes one or more processors in a processor complex 12. Processor complex 12 is coupled by processor bus 14 to core logic chipset 13, which interconnects processor bus 14 to memory bus 15 and I/O (input/output) bus 17. Memory bus 15 couples core logic 13 to a memory subsystem 16 that stores instructions and data for access by processor complex 12. I/O bus 17 similarly couples core logic chipset 13 to an I/O subsystem including four I/O controllers 18a–18d.

Each I/O controller 18 in the I/O subsystem includes a respective host bridge 20, which controls the transfer of addresses and data between I/O bus 17 and devices mounted in the slots 21 of a respective one of Peripheral Component Interconnect (PCI) buses 22a–22d. As is well-known in the art, slots 21 support the connection of a wide variety of the PCI-compatible devices such as peripheral adapters and controllers. In a preferred embodiment of the present invention, the PCI-compatible devices mounted in slots 21 include a processor card 24 having a service processor 26 that serves as a hardware and software system monitor. The functionality of service processor 26 is governed by system monitoring software stored in service processor (SP) memory 28.

To promote high performance, each of buses 14, 15 and 17 are preferably high speed buses whose operation is timed and synchronized by a 100 MHz master clock signal 34 generated by master clock source 30 and distributed to processor complex 12, core logic chipset 13, memory subsystem 16, and I/O controllers 18a–18d by master clock driver 32. Because current PCI standards support only 33 MHz and 66 MHz operation, the operation of PCI buses 22a–22d and the PCI-compatible devices installed in slots 21 cannot be directly timed by the 100 MHz master clock signal 34 distributed by master clock driver 32. Accordingly, each of I/O controllers 18a–18d includes a respective PLL clock generator 40 that synthesizes a respective derivative PCI clock signal 42 from the 100 MHz master clock signal 34. Each derivative PCI clock signal 42 is driven to the slots 21 of theI associated PCI local bus 22 by a respective clock driver 44.

Depending on the requirements of the system, the frequencies of derivative PCI clock signals 42 may be the same as or different from each other and may further be configurable. In the embodiment shown in FIG. 1, PCI local buses 22a and 22d only operate at 33 MHz, and PCI local buses 22c and 22d can be operated at either 33 MHz or 66 MHz. Regardless of the frequency of derivative PCI clock signals 42, derivative PCI clock signals 421 each have a defined phase relationship with master clock signal 34 and therefore with each other.

Figure 2:
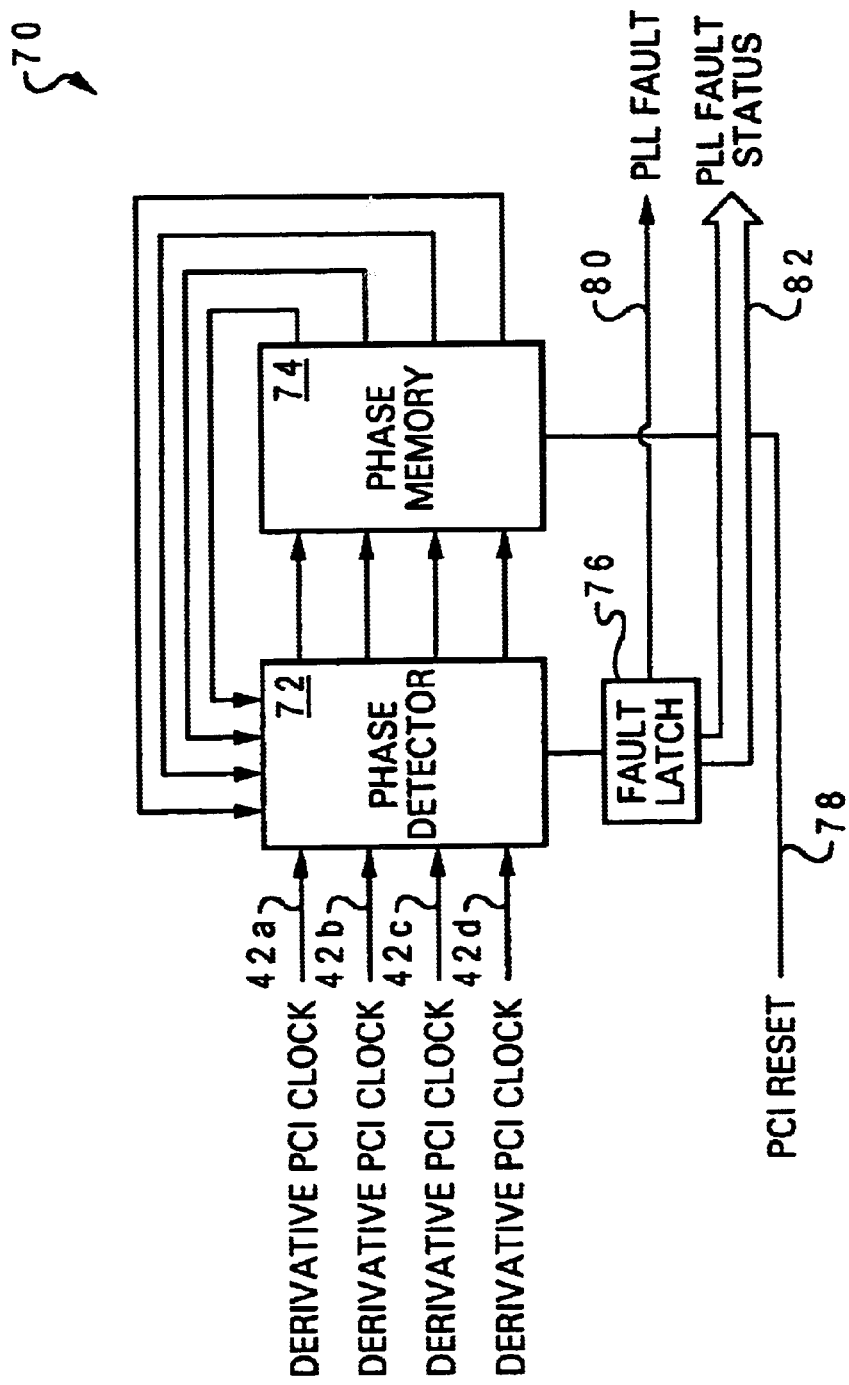
FIG. 2 depicts a PLL clock synthesis fault detector in accordance with the present invention.

In order to detect transient faults in the derivative PCI clock signals 42 synthesized from the 100 MHz master clock signal 34 by PLL clock generators 40, data processing system 10 is equipped with PLL clock synthesis fault detector 70. As depicted in greater detail in FIG. 2, PLL clock synthesis fault detector 70 includes a phase detector 72, a phase memory 74, and a fault latch 76. Phase detector 72 has a set of detection input signals that include derivative PCI clock signals 42a–42d and, although not illustrated, may also include other signals derived from master clock signal 34. Phase detector 72 continuously detects the phases of derivative PCI clock signals 42a–42d and provides an indication of the phase of each derivative PCI bus clock signal 42 to phase memory 74. Phase memory 74 captures and stores the phase indication for each detection input in response to assertion of PCI reset signal 78, for example, following power-on of data processing system 10 or reconfiguration of one or more of PCI local buses 22. Phase memory 74 then supplies these historical phase indications to phase detector 72 until PCI reset signal 78 is again asserted and new phase indications are captured. Thus, phase memory 74 may supply the same historical phase indications to phase detector 72 for many billions of cycles of master clock signal 34.

Phase detector 72 compares the currently detected phases of derivative PCI clock signals 42 with the corresponding historical phase indications provided by phase memory 74. If all of the detected phases match the historical phases (as is typical), it is presumed that no PLL clock synthesis fault has occurred. However, if at least one detected phase does not match the corresponding historical phase, phase detector 72 stores into fault latch 76 an indication of each PLL clock generator 40 that has experienced a PLL clock synthesis fault. Fault latch 76 in turn provides PLL fault signal 80 to service processor 26, which can log the PLL clock synthesis fault as a performance monitor event and initiate appropriate error recovery operations. Such error recovery operations may include reading the contents of fault latch 76, which are designated in FIG. 2 as PLL fault status 82.

As has been described, the present invention provides an improved method and system for detecting PLL "cycle slip" errors such as clock synthesis faults. According to the present invention, a current phase of a signal is compared with a historical phase of the signal to determine if the phase of the signal has changed. If so, the occurrence of a fault is logged and reported. In other embodiments of the present invention, other mechanisms for detecting a phase change of a derivative clock signal can be implemented. For example, the phase difference between two derivative clock signals can be compared between cycles to determine if the phase difference between the derivative clock signals has changed.

While the invention has been particularly shown and described with reference to a preferred embodiment, it will be understood by those skilled in the art that various changes in form and detail may be made therein without departing from the spirit and scope of the invention.

What is claimed is:

1. A method of detecting clock signal errors in an electronic system, said method comprising:
   storing a historical indication of a phase of a derivative clock signal synthesized from a reference clock signal, wherein said derivative clock signal has a period;
   after multiple periods of said derivative clock signal have elapsed since storing the historical indication of the phase of the derivative clock signal, detecting a change of phase of said derivative clock signal by reference to said historical indication; and
   in response to said detection, signaling that a clock synthesis fault has occurred.

2. The method of claim 1, wherein storing a historical indication of phase comprises storing a historical indication of a phase of said derivative clock signal with respect to said reference clock signal.

3. The method of claim 1, wherein said derivative clock signal is a first derivative clock signal, and wherein storing a historical indication of phase comprises storing a historical indication of a phase of said first derivative clock signal with respect to a second derivative clock signal.

4. The method of claim 1, said electronic system comprising a data processing system having a system performance monitor, wherein said signaling step comprises signaling said system performance monitor.

5. The method of claim 1, wherein said derivative clock signal is one of a plurality of derivative clock signals, and wherein said signaling step comprises signaling which of said plurality of derivative clock signals has experienced a clock synthesis fault.

6. The method of claim 1, and further comprising:
   in response to a reset signal, updating said historical indication of the phase of said derivative clock signal.

7. The method of claim 1, and further comprising synthesizing said derivative clock signal from said reference clock signal utilizing a phase-locked loop clock generator.

8. A phase-locked loop clock synthesis fault detector, comprising:
  data storage that stores a historical indication of a phase of a derivative clock signal synthesized from a reference clock signal; and
  a phase detector, coupled to said data storage and to said derivative clock signal, that, after multiple periods of said derivative clock signal have elapsed since storing the historical indication of the phase of the derivative clock signal within the data storage, detects a change of phase of said derivative clock signal by reference to said historical indication and, in response to said detection, signals that a clock synthesis fault has occurred.

9. The phase-locked loop clock synthesis fault detector of claim 7, wherein said historical indication of phase comprises a historical indication of a phase of said derivative clock signal with respect to said reference clock signal.

10. The phase-locked loop clock synthesis fault detector of claim 7, wherein said derivative clock signal is a first derivative clock signal, and wherein said historical indication of phase comprises a historical indication of a phase of said derivative clock signal with respect to a second derivative clock signal.

11. The phase-locked loop clock synthesis fault detector of claim 7, wherein said derivative clock signal is one of a plurality of derivative clock signals, said phase-locked loop clock synthesis fault detector further comprising a fault latch, coupled to said phase detector, that, in response to a detection of a change in phase of one of said plurality of derivative clock signals, latches an indication of which of said plurality of derivative clock signals has experienced a clock synthesis fault.

12. The phase-locked loop clock synthesis fault detector of claim 7, wherein said data storage has a refresh input that, when asserted, causes said data storage to update said historical indication of the phase with a current phase.

13. An electronic system, comprising:
  a reference clock that generates a reference clock signal;
  at least one phase-locked loop clock generator that synthesizes a derivative clock signal from said reference clock signal;
  at least one digital circuit timed by said derivative clock signal; and
  a phase-locked loop clock synthesis fault detector, including:
    data storage that stores a historical indication of a phase of said derivative clock signal; and
    a phase detector, coupled to said data storage and to said derivative clock signal, that, after multiple periods of said derivative clock signal have elapsed since storing the historical indication of the phase of the derivative clock signal, detects a change of phase of said derivative clock signal by reference to said historical indication and, in response to said detection, signals that a clock synthesis fault has occurred.

14. The electronic system of claim 12, wherein said historical indication of phase comprises a historical indication of a phase of said derivative clock signal with respect to said reference clock signal.

15. The electronic system of claim 12, wherein said derivative clock signal is a first derivative clock signal, and wherein said historical indication of phase comprises a historical indication of a phase of said derivative clock signal with respect to a second derivative clock signal.

16. The electronic system of claim 12, wherein said derivative clock signal is one of a plurality of derivative clock signals, said phase-locked loop clock synthesis fault detector further comprising a fault latch, coupled to said phase detector, that, in response to a detection of a change in phase of one of said plurality of derivative clock signals, latches an indication of which of said plurality of derivative clock signals has experienced a clock synthesis fault.

17. The electronic system of claim 15, said electronic system further comprising a system performance monitor, wherein said fault latch provides an indication of which of said plurality of derivative clock signals has experienced a clock synthesis fault to said system performance monitor.

18. The electronic system of claim 12, wherein said data storage has a refresh input that, when asserted, causes said data storage to update said historical indication of the phase with a current phase.

19. The electronic system of claim 12, wherein said electronic system comprises a computer system.

20. A data processing system, comprising:
  a reference clock that generates a reference clock signal;
  a phase-locked loop clock generator that synthesizes a derivative clock signal from said reference clock signal;
  an interconnect;
  at least one processor and at least one peripheral device coupled by said interconnect, wherein communication on said interconnect is timed by said derivative clock signal; and
  a phase-locked loop clock synthesis fault detector, including:
    data storage that stores a historical indication of a phase of said derivative clock signal; and
    a phase-detector, coupled to said data storage and to said derivative clock signal, that, after multiple periods of said derivative clock signal have elapsed since storing the historical indication of the phase of the derivative clock signal, detects a change of phase of said derivative clock signal by reference to said historical indication and, in response to said detection, signals that a clock synthesis fault has occurred.

* * * * *